(12) United States Patent
Henri et al.

(10) Patent No.: US 7,955,990 B2
(45) Date of Patent: Jun. 7, 2011

(54) METHOD FOR IMPROVED THICKNESS REPEATABILITY OF PECVD DEPOSITED CARBON FILMS

(75) Inventors: Jon Henri, West Linn, OR (US); Gishun Hsu, Santa Clara, CA (US); Robert Sculac, Lake Oswego, OR (US); Scott Stoddard, Sherwood, OR (US)

(73) Assignee: Novellus Systems, Inc., San Jose, CA (US)

( * ) Notice: Subject to any disclaimer, the term of this patent is extended or adjusted under 35 U.S.C. 154(b) by 174 days.

(21) Appl. No.: 12/334,220

(22) Filed: Dec. 12, 2008

(65) Prior Publication Data

US 2010/0151691 A1    Jun. 17, 2010

(51) Int. Cl.
*H01L 21/31* (2006.01)
(52) U.S. Cl. ........ 438/758; 438/703; 438/761; 438/778; 438/780; 257/E21.24
(58) Field of Classification Search .................. None
See application file for complete search history.

(56) References Cited

U.S. PATENT DOCUMENTS

| | | |
|---|---|---|
| 4,209,357 A | 6/1980 | Gorin et al. |
| 4,274,841 A * | 6/1981 | Andersen et al. |
| 4,668,261 A | 5/1987 | Chatzipetros et al. |
| 4,863,493 A | 9/1989 | Kotani et al. |
| 4,863,760 A | 9/1989 | Schantz et al. |
| 5,231,057 A | 7/1993 | Doki et al. |
| 5,261,250 A | 11/1993 | Missimer |
| 5,378,316 A | 1/1995 | Franke et al. |
| 5,470,661 A | 11/1995 | Bailey et al. |
| 5,562,952 A * | 10/1996 | Nakahigashi et al. ........ 427/534 |
| 5,670,066 A | 9/1997 | Barnes et al. |
| 6,030,591 A | 2/2000 | Tom et al. |
| 6,035,803 A | 3/2000 | Robles et al. |
| 6,041,734 A | 3/2000 | Raoux et al. |
| 6,066,209 A | 5/2000 | Sajoto et al. |
| 6,150,719 A | 11/2000 | Saia et al. |
| 6,241,793 B1 | 6/2001 | Lee et al. |
| 6,286,321 B1 | 9/2001 | Glater |
| 6,319,299 B1 | 11/2001 | Shih et al. |
| 6,331,480 B1 | 12/2001 | Tsai et al. |
| 6,465,051 B1 | 10/2002 | Sahin et al. |
| 6,478,924 B1 | 11/2002 | Shamouilian et al. |

(Continued)

FOREIGN PATENT DOCUMENTS

WO    2005/048367    *    5/2005

OTHER PUBLICATIONS

U.S. Office Action mailed Dec. 14, 2006, from U.S. Appl. No. 11/318,269.

(Continued)

*Primary Examiner* — N Drew Richards
*Assistant Examiner* — Kyoung Lee
(74) *Attorney, Agent, or Firm* — Weaver Austin Villeneuve & Sampson LLP

(57) ABSTRACT

Provided herein are improved methods of depositing carbon-based films using acetylene as a precursor. The methods involve using a low-vapor pressure solvent, e.g., dimethylfluoride (DMF) to stabilize the acetylene and delivering the acetylene to a deposition chamber. The methods provide improved wafer-to-wafer thickness uniformity and increase the usable amount of acetylene in an acetylene source to over 95%.

17 Claims, 11 Drawing Sheets

U.S. PATENT DOCUMENTS

| | | | |
|---|---|---|---|
| 6,541,397 | B1 | 4/2003 | Bencher |
| 6,573,030 | B1 | 6/2003 | Fairbairn et al. |
| 6,617,553 | B2 | 9/2003 | Ho et al. |
| 6,777,349 | B2* | 8/2004 | Fu et al. |
| 6,967,072 | B2 | 11/2005 | Latchford et al. |
| 7,223,526 | B2 | 5/2007 | Fairbairn et al. |
| 7,314,506 | B2 | 1/2008 | Vininski et al. |
| 7,323,401 | B2 | 1/2008 | Ramaswamy et al. |
| 7,381,644 | B1 | 6/2008 | Subramonium et al. |
| 7,820,556 | B2 | 10/2010 | Hsu et al. |
| 2001/0021491 | A1 | 9/2001 | Chen et al. |
| 2002/0182848 | A1 | 12/2002 | Joseph et al. |
| 2003/0044532 | A1 | 3/2003 | Lee et al. |
| 2004/0016972 | A1 | 1/2004 | Singh et al. |
| 2004/0018750 | A1 | 1/2004 | Sophie et al. |
| 2004/0023502 | A1 | 2/2004 | Tzou et al. |
| 2004/0140506 | A1 | 7/2004 | Singh et al. |
| 2004/0180551 | A1 | 9/2004 | Biles et al. |
| 2004/0224504 | A1 | 11/2004 | Gadgil |
| 2004/0266195 | A1 | 12/2004 | Dokumaci et al. |
| 2005/0042889 | A1 | 2/2005 | Lee et al. |
| 2005/0098119 | A1 | 5/2005 | Burger et al. |
| 2005/0112506 | A1 | 5/2005 | Czech et al. |
| 2005/0130404 | A1* | 6/2005 | Moghadam et al. |
| 2006/0091559 | A1 | 5/2006 | Nguyen et al. |
| 2006/0154086 | A1 | 7/2006 | Fuller et al. |
| 2006/0197881 | A1 | 9/2006 | Kang et al. |
| 2006/0205223 | A1 | 9/2006 | Smayling |
| 2007/0048674 | A1 | 3/2007 | Wells |
| 2007/0054500 | A1* | 3/2007 | Bencher |
| 2007/0059913 | A1 | 3/2007 | King et al. |
| 2007/0105303 | A1* | 5/2007 | Busch et al. |
| 2007/0125762 | A1 | 6/2007 | Cui et al. |
| 2007/0128538 | A1 | 6/2007 | Fairbairn et al. |
| 2007/0166546 | A1 | 7/2007 | Ichikawa et al. |
| 2007/0166979 | A1 | 7/2007 | Wang et al. |
| 2007/0202640 | A1* | 8/2007 | Al-Bayati et al. |
| 2007/0247073 | A1 | 10/2007 | Paterson et al. |
| 2008/0128907 | A1 | 6/2008 | Yang et al. |
| 2008/0242912 | A1 | 10/2008 | Letessier et al. |
| 2008/0254641 | A1 | 10/2008 | Kobayashi et al. |
| 2009/0182180 | A1 | 7/2009 | Huang et al. |
| 2009/0305516 | A1* | 12/2009 | Hsu et al. |
| 2010/0151691 | A1 | 6/2010 | Henri et al. |

OTHER PUBLICATIONS

Ikeda et al., "Top-PECVD": A New Conformal Plasma Enhanced CVD Technology using TEOS, Ozone and Pulse-modulated RF Plasma,' 1992 IEEE, pp. 11.2.1-11.2.4.

Subramonium et al., "Methods of Depositing Highly Selective Transparent Ashable Hardmask Films", U.S. Appl. No. 11/449,983, filed Jun. 8, 2006.

Subramonium et al., "Methods of Depositing Stable and Hermetic Ashable Hardmask Films," Novellus Systems, Inc., U.S. Appl. No. 11/710,377, filed Feb. 22, 2007, pp. 1-26.

Notice of Allowance and Fee Due mailed May 7, 2007 from U.S. Appl. No. 11/318,269.

Allowed Claims from U.S. Appl. No. 11/318,269.

Fang et al., "Methods of Improving Ashable Hardmask Adhesion to Metal layers," Novellus Systems, Inc., U.S. Appl. No. 11/612,382, filed Dec. 18, 2006.

U.S. Office Action mailed Oct. 9, 2007, from U.S. Appl. No. 11/612,382.

Grill, et al. "Diamondlike carbon films by rf plasma-assisted chemical vapor deposition from acetylene," IBM J. Res. Develop., vol. 34, No. 6, Nov. 1990, pp. 849-857.

Callegari et al., "Optical properties of hydrogenated amorphous-carbon film for attenuated phase-shift mask applications," J.Vac. Sci. Technol. B 11(6), Nov./Dec. 1993, pp. 2697-2699.

Grill, A. "Diamond-like carbon: state of the art," Diamond and Related Mateials 8 (1999) 428-434.

Grill, A., "Plasma-deposited diamondlike carbon and related materials," IBM Journal of Research and Development, vol. 43, ½, 1999, http://research.ibm.com/journal/rd/431/grill.html. 14 pages.

Kragler et al., "Scanning tunneling microscopy based lithography employing amorphous hydrogenated carbon as a high resolution resist mask," Appl. Phys. Lett. 67 (8), Aug. 21, 1995, pp. 1163-1165.

U.S. Office Action mailed Dec. 27, 2007, from U.S. Appl. No. 11/449,983.

Subramonium et al., "Pulsed PECVD Method for Modulating Hydrogen Content in Hard Mask," Novellus Systems, Inc., U.S. Appl. No. 12/048,967, filed Mar. 14, 2008.

Subramonium et al., "Methods and Apparatus for Plasma-Based Deposition," Novellus Systems, Inc., U.S. Appl. No. 11/849,208, filed Aug. 31, 2007.

U.S. Office Action mailed Jul. 9, 2008, from U.S. Appl. No. 11/449,983.

U.S. Final Office Action mailed May 13, 2008, from U.S. Appl. No. 11/612,382.

U.S. Office Action mailed Aug. 19, 2008, from U.S. Appl. No. 11/612,382.

Subramonium et al., "Methods of Depositing Smooth and Conformal Ashable Hard Mask Films," Novellus Systems, Inc., U.S. Appl. No. 12/163,670, filed Jun. 27, 2008.

Hsu et al., "Method for Purifying Acetylene Gas for Use in Semiconductor Processes," Novellus Systems, Inc., U.S. Appl. No. 12/133,223, filed Jun. 4, 2008.

U.S. Office Action mailed Jan. 5, 2009, from U.S. Appl. No. 11/449,983.

U.S. Office Action mailed Jan. 5, 2009, from U.S. Appl. No. 11/710,377.

U.S. Appl. No. 11/612,382, Office Action mailed Feb. 24, 2009.*
U.S. Appl. No. 11/612,382, Office Action mailed May 12, 2009.*
U.S. Appl. No. 11/710,377, Office Action mailed Aug. 19, 2009.*
U.S. Appl. No. 12/133,223, Office Action mailed Aug. 19, 2009.*
U.S. Appl. No. 11/449,983, Office Action mailed Sep. 15, 2009.*
U.S. Appl. No. 11/612,382, Office Action mailed Dec. 9, 2009.*
U.S. Appl. No. 12/133,223, Office Action mailed Dec. 21, 2009.*
U.S. Appl. No. 12/133,223, Notice of Allowance mailed Mar. 2, 2010.*
U.S. Appl. No. 11/710,377, Office Action mailed Mar. 31, 2010.
U.S. Appl. No. 11/612,382, Office Action mailed Mar. 26, 2010.
U.S. Appl. No. 12/766,721, "Methods For Forming Conductive Carbon Films by PECVD", Fox et al., filed Apr. 23, 2010.
U.S. Appl. No. 12/786,842, "Method for purifying acetylene gas for use in semiconductor processes", Hsu et al., filed May 25, 2010.
U.S. Appl. No. 11/449,983, Office Action mailed Jun. 21, 2010.
Korean Office Action mailed Jun. 1, 2010 for Application No. 2009-0048358.
U.S. Appl. No. 11/849,208, Office Action mailed Sep. 3, 2010.
U.S. Appl. No. 12/048,967, Office Action mailed Nov. 22, 2010.
U.S. Appl. No. 11/449,983, Office Action mailed Dec. 30, 2010.

* cited by examiner

METHOD FOR IMPROVED THICKNESS REPEATABILITY OF PECVD DEPOSITED CARBON FILMS

BACKGROUND OF THE INVENTION

Acetylene is known to be explosive when pressurized above 15 psig. To avoid explosions during storage and transportation, acetylene is typically stored in a canister or cylinder filled with a porous material having a stabilizer. Acetone is commonly used for as a stabilizer in part because acetylene is highly soluble in acetone. One volume of liquid acetone can absorb twenty-five volumes of gaseous acetylene at temperatures of about 15° C. under atmospheric pressure and will continue to absorb an additional twenty-five volumes of acetylene for every additional atmosphere of pressure to which acetylene is subjected (*The Encyclopedia Britannica: A Dictionary of Arts, Sciences, Literature and General Information*, Hugh Chisholm, University Press 1910). In using acetylene as a precursor for the deposition of carbon films in chemical vapor deposition (CVD) processes, the cylinders are connected to a gas line. Acetylene is then fed into the line for introduction to the deposition chamber.

SUMMARY OF THE INVENTION

Provided herein are improved methods of depositing carbon-based films using acetylene as a precursor. The methods involve using a low-vapor pressure solvent, e.g., dimethylfluoride (DMF) to stabilize the acetylene and delivering the acetylene to a deposition chamber. The methods provide improved wafer-to-wafer thickness uniformity and increase the usable amount of acetylene in an acetylene source to over 95%. The concentration of acetone or other acetylene storage solvent in the acetylene gas stream varies substantially depending on the ratio of acetylene to acetone in the storage cylinder. Typically, the acetone content in the acetylene gas stream tends to increase as more acetylene is used from the cylinder. This presents a particular difficulty when using acetylene in processes where acetone, and particularly the relative amount of acetone in the acetylene, impacts the quality of the resulting product. The inventors have observed that providing acetylene from a tank as a precursor into a deposition chamber creates major problems during the deposition process as more acetylene is consumed from tank.

BRIEF DESCRIPTION OF THE DRAWINGS

The present invention will be readily understood by the following detailed description in conjunction with the accompanying drawings, in which.

DETAILED DESCRIPTION OF THE PREFERRED EMBODIMENTS

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Many of the process parameters listed here correspond to a Novellus Vector™ module having four stations for depositing an ashable hard mask on a 300 mm wafer. However, the invention applies to any semiconductor deposition chamber using acetylene gas stream for semiconductor processing.

One skilled in the art will readily appreciate that the process parameters may be scaled based on the deposition chamber volume, wafer size, and other factors. For example, power outputs of LF and HF generators are typically directly proportional to the deposition surface area of the wafer. The power used on 300 mm wafer is generally 2.25 higher than the power used for 200 mm wafer. Similarly, flow rates depend on the free volume of the deposition chamber, which is 195 L for each of four Novellus Vector™ deposition chambers.

Figure 1:
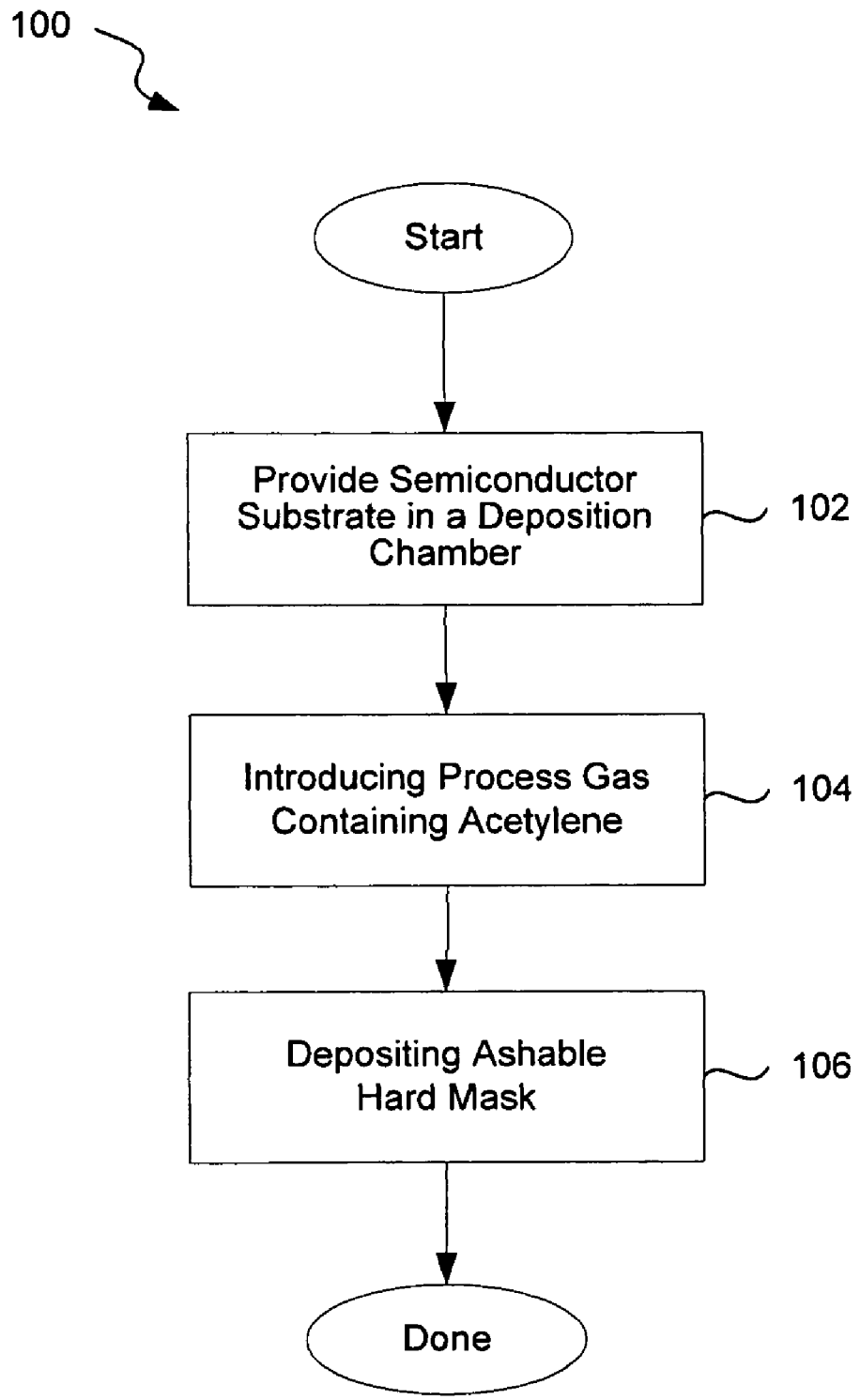
FIG. 1 is a flowchart illustrating important stages in a general process flow for a method of forming ashable hard mask in accordance with the present invention.

FIG. 1 illustrates stages in a general process flow for forming an ashable hard mask in accordance with certain embodiments of the present invention. Ashable hardmasks are carbon-based films used as etch masks that can be removed after use by oxidation. In certain embodiments, they are amorphous carbon-based films. Amorphous carbon-based films may also be used to form other types of films used in semiconductor processing. It should be understood that the invention is not limited to ashable hard mask deposition processes or even to semiconductor fabrication applications. In the depicted embodiment, the method 100 begins with providing a semiconductor substrate in a deposition chamber (block 102). For example, a semiconductor substrate could be a 300-mm semiconductor wafer suitable for a Novellus Vector™ module. A precursor process gas including acetylene is then introduced into the chamber (block 104). Depending on deposition chamber size and other process parameters the flow rate of acetylene may be about 3,000-10,000 sccm during the deposition process. In one embodiment, the flow rate of acetylene may be about 5,000-8,000 sccm. Other stages of semiconductor processing, such as cleaning of the chamber, may not involve carbon containing precursors. The process gas may also include other carbon containing precursors, such as methane, ethylene, propylene, butane, cyclohexane, benzene and toluene, and others.

A carrier gas may be used to dilute the precursor. The carrier gas may include any suitable carrier gas employed in semiconductor processing, such as helium, argon, nitrogen, hydrogen, or a combination of these. The overall carrier gas flow rate may depend on deposition chamber size and other process parameters and may range from about 500 to 10,000 sccm. In a specific embodiment, nitrogen and helium are used as carrier gases having corresponding flow rates ranges of about 500-5,000 sccm and about 300-3,000 sccm. Other stages of semiconductor processing may include different processing gases and different flow rates.

In the depicted embodiment, an ashable hard mask is then deposited on the semiconductor substrate by a plasma enhanced chemical vapor deposition (PECVD) or other deposition processes (block 106). Plasma may be generated using dual-frequency plasma generation process. For example, a low frequency (LF) generator may provide about 200-1000 W at about 50-400 kHz, while a high frequency (HF) generator may provide about 500-2,000 W at about 2-60 MHz during the deposition process. Additional description of a suitable process apparatus is provided in the context of FIG. 10. The deposition process may be performed when substrate temperature is between about 100 and 500° C. The pressure of the deposition chamber may be maintained at about 2-15 Torr. One example of process conditions for ashable hard mask deposition is summarized in Table 1. Deposition is continued until the desired thickness of film is deposited. According to various embodiments, between about 1,000 and 9,000 angstroms is deposited.

TABLE 1

| Parameter | Typical Process Range |
| --- | --- |
| $C_2H_2$ Flow Rate | 1,000-10,000 sccm |
| $N_2$ Flow Rate | 0-5,000 sccm |
| He Flow Rate | 0-3,000 sccm |
| $H_2$ Flow Rate | 0-10,000 sccm |
| LF Power at Frequency | 0-2,400 W at 50-400 kHz |
| HF Power at Frequency | 500-2,000 W at 2-60 MHz |
| Pressure | 0.5-15 Torr |
| Temperature | 150-700° C. |
| Total Deposited Thickness | 250-10,000 Å |

It should be noted that the present invention is not limited to the deposition of ashable hardmask films at the process conditions above, but applies to deposition of any carbon-based film using acetylene as a precursor in semiconductor processing. This includes, but is not limited to, plasma-enhanced CVD processes, thermal CVD processes, high density plasma CVD, etc. All of the above process conditions may be varied outside the example ranges shown in Table 1, so long as acetylene is used as a process gas. While examples of flow rates are described above in Table 1, in certain embodiments, the methods of the invention are used with low flow rate processes, e.g., 100-1000 sccm acetylene flow or lower. Dilution at these low flow rates may be particularly detrimental to the repeatability, so the use of low vapor pressure stabilizers is advantageous.

Acetylene for semiconductor processing is usually supplied in cylinders (also referred to as bottles) storing 200-500 cubic feet of acetylene (at standard temperature and pressure) where acetylene is dissolved in acetone. Acetylene vendors include Dow Chemicals, Air Products, PraxAir, Air Gas and other suppliers. Acetylene can begin to decompose at pressures above 15 psig. Considerable amounts of heat can be generated from the decomposition of acetylene, which can result in explosions of great force. For theses reasons, acetylene cylinders are supplied with safety pressure regulators that limit the pressure in receiving lines to 15 psig. However, the overhead pressure inside the cylinder may reach and exceed 200 psi by means of various safety devices and techniques. Considering that deposition chambers are usually operated at low pressures, 15 psig or less is a sufficiently high driving pressure to flow an acetylene gas stream through a pre-process module and into the deposition chamber. For example, a typical deposition process using Novellus Vector apparatus requires a flow rate of about 6750 standard cubic centimeters per minute (sccm) (6.75 L/min) while the deposition chamber is maintained at 8 Torr. As discussed above, flow rates and chamber pressures may vary depending on process requirements.

Figure 2:
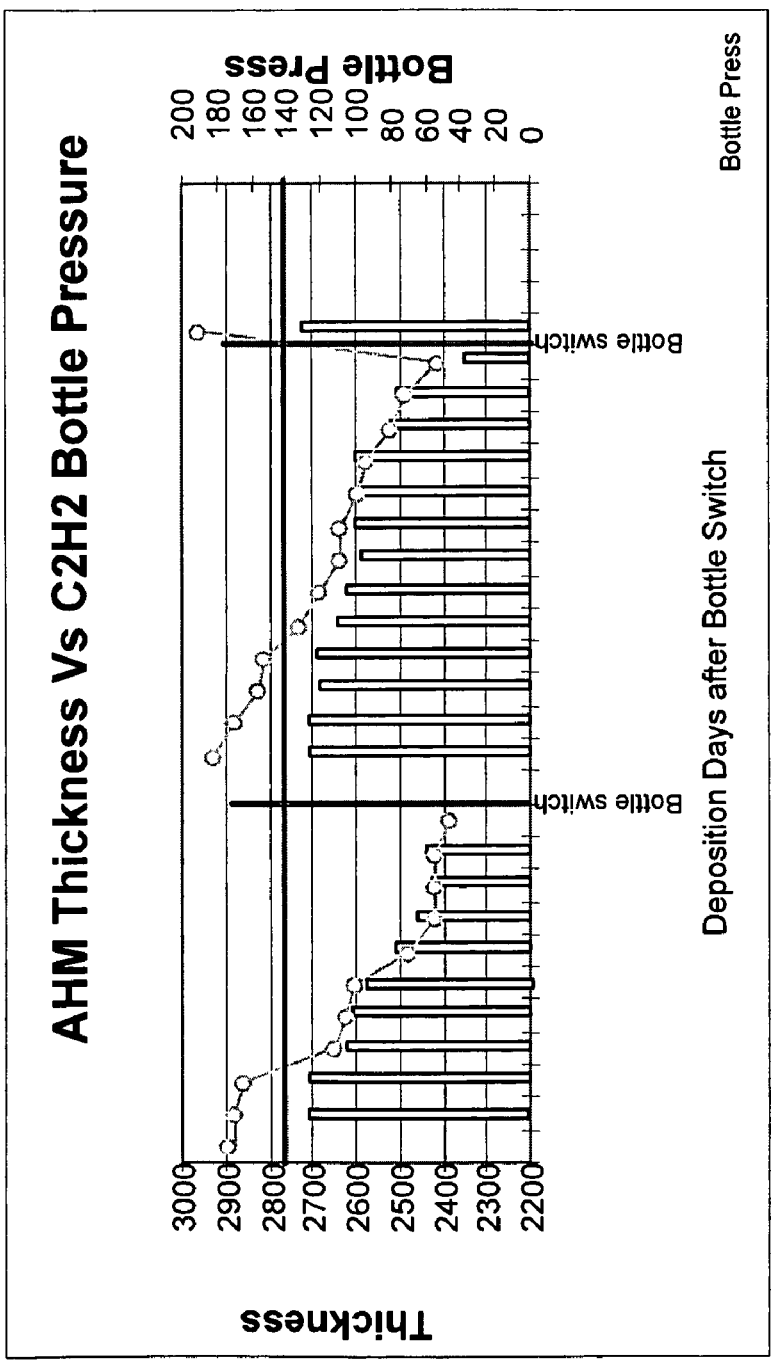
FIG. 2 is a graph showing ashable hardmask thickness as a function of acetylene bottle pressure for ashable hardmasks deposited using acetone-stabilized bottles.

To date, acetylene bottles used in semiconductor processing have been stabilized with acetone, which reduces the explosion risk. Acetone is used as a stabilizer in semiconductor processing because it is less toxic and less expensive than other stabilizers. The inventors have found, however, that providing acetylene from an acetone-stabilized bottle results in problems during the deposition process as more acetylene is consumed from bottle. Specifically, it was found that use of acetone significantly reduces the deposition rate, making thickness uniformity hard to maintain. FIG. 2 shows ashable hardmask thickness as a function of acetylene bottle pressure. Approximately 500 wafers were processed each day, with target thickness of 2700 Angstroms deposited on each. Deposition (exposure) time and other process conditions remained constant from day to day. Notably outlet pressure of the gas from the bottle was held constant. Actual deposited thickness is shown by the bars and bottle pressure by the dotted line. Bottle pressure was measured during deposition on a particular day. FIG. 2 shows that as acetylene bottle pressure is reduced, deposition thickness decreases. It was found that there is a certain amount of acetone in the acetylene stream and as acetylene bottle pressure decreases, the amount of acetone in the acetylene gas stream increases, thereby diluting the gas stream and reducing deposition rate. This relationship between bottle pressure and deposition rate was unexpected. This is because in typical semiconductor gases the relationship between bottle pressure and deposition rate is unvarying as long as the outlet pressure of the gas from the bottle remains constant.

The dilution makes thickness repeatability difficult to maintain. As a result of the dilution, no more than about 20% of an acetone-stabilized acetylene bottle can be used in carbon film deposition—above this level, the film thickness varies unacceptably from wafer to wafer.

Figure 3A:
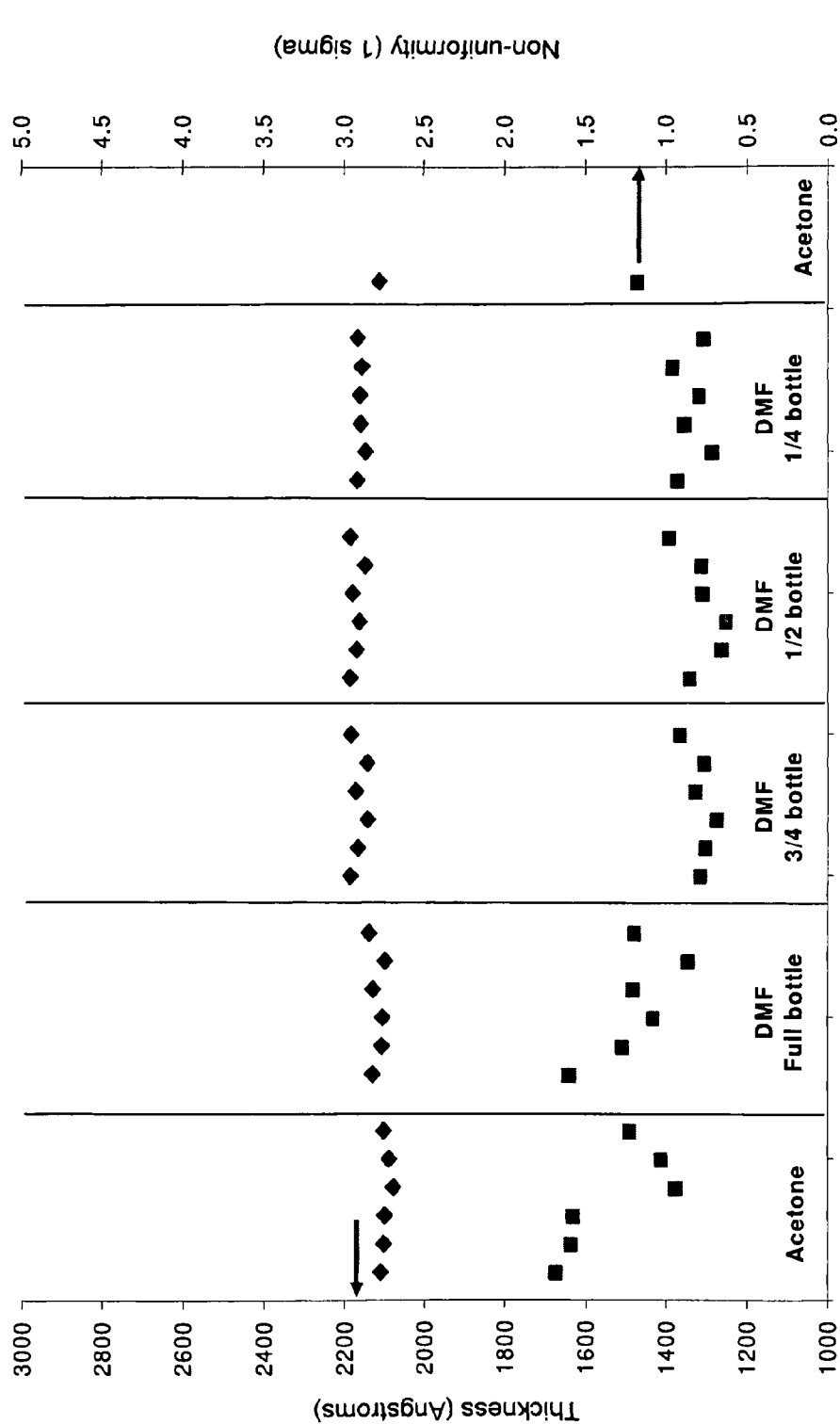
FIG. 3A is a plot showing the thickness repeatability obtained using DMF-stabilized bottles throughout the life of a bottle. Thickness and thickness non-uniformity are shown on the left and right y-axis, respectively, for ashable hardmask films deposited using acetylene bottles at 0-¼-full, ¼-½ full, ½-¾ full and ¾-completely full (as based on total bottle pressure), as compared to films deposited using full acetone-stabilized bottles.
Figure 3B:
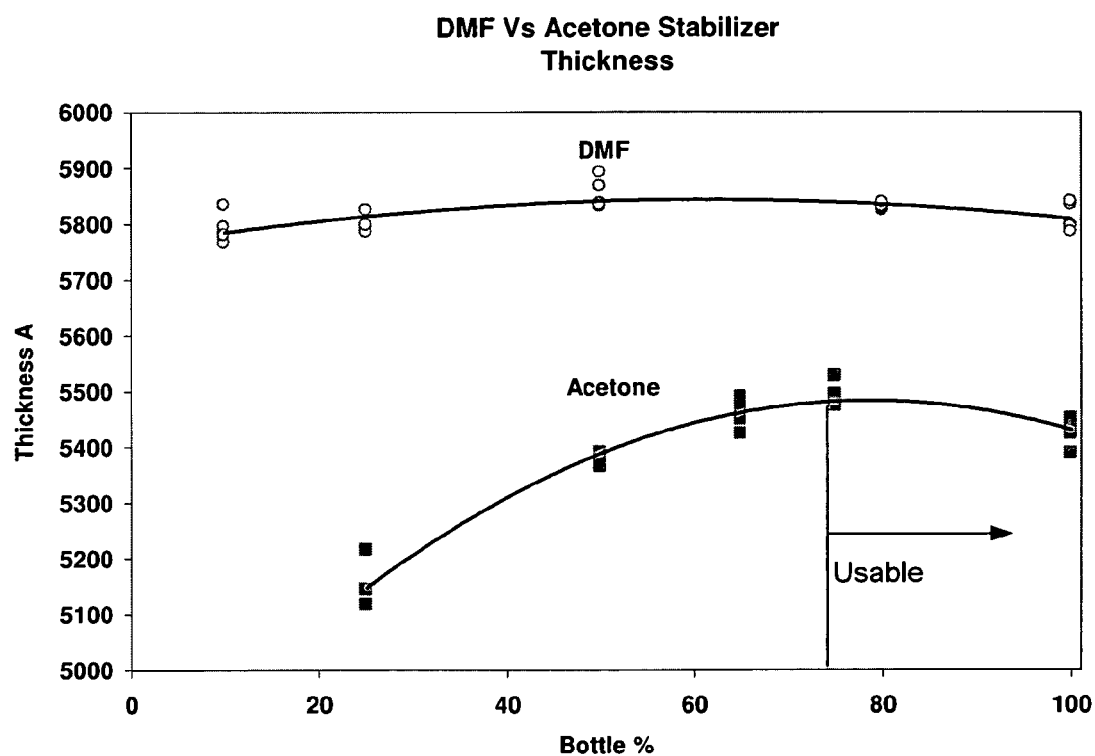
FIG. 3B is a graph showing a comparison of thickness for an ashable hardmask deposition process using DMF-stabilized acetylene vs. using acetone-stabilized acetylene bottles as functions of acetylene usage.

In certain embodiments of the methods of the invention, dimethylformadide (DMF) stabilized acetylene bottles are used to deposit carbon films. Prior to the invention, DMF was not used in processing applications due to its toxicity and higher cost. The inventors found however, that unlike with acetone-stabilized bottles, there is no thickness trending through the life of an acetylene bottle. FIG. 3A shows the thickness repeatability obtained using DMF-stabilized bottles throughout the life of a bottle. Thickness and thickness non-uniformity are shown on the left and right y-axis, respectively, for acetylene bottles at 0-¼-full, ¼-½ full, ½-¾ full and ¾-completely full (as based on total bottle pressure), as compared to films deposited using full acetone bottles. Deposition time and conditions were unvaried through the life of the bottle. As can be seen from FIG. 3A, thickness remains substantially constant through the bottle, meaning that an entire bottle (e.g., >90%) of acetylene can be used without interruption to change or recharge a bottle. FIG. 3B shows a comparison of thickness for an ashable hardmask deposition process using DMF-stabilized acetylene vs. using acetone-stabilized acetylene bottles for the same ashable hardmask deposition time. The thickness of the ashable hardmask-deposited films is constant over the life of the DMF-stabilized bottle. For acetone, however, the thickness drops over 200 Angstroms over the life of the bottle. As indicated on the graph, after about 20% of the acetylene in the acetone-stabilized bottle is used, the bottle is no longer acceptable for manufacturing processes. Not only do the DMF-stabilized bottles provide thickness repeatability over the life of the bottle (thickness varying by no more than about 1% over bottle life in certain embodiments), but the DMF-stabilized bottles provide higher deposition rates than even full acetone-stabilized bottles.

Figure 4A:
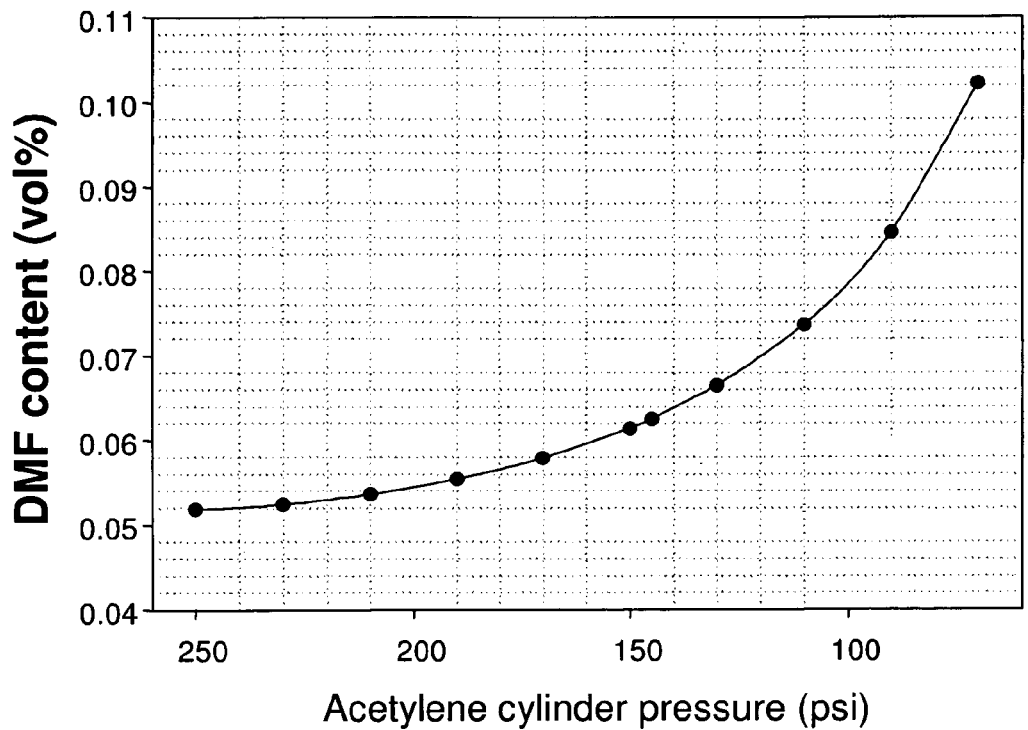
FIG. 4A is a graph showing the percent volume of stabilizer in an acetylene stream as a function of acetylene bottle pressure using a DMF-stabilized acetylene source.
Figure 4B:
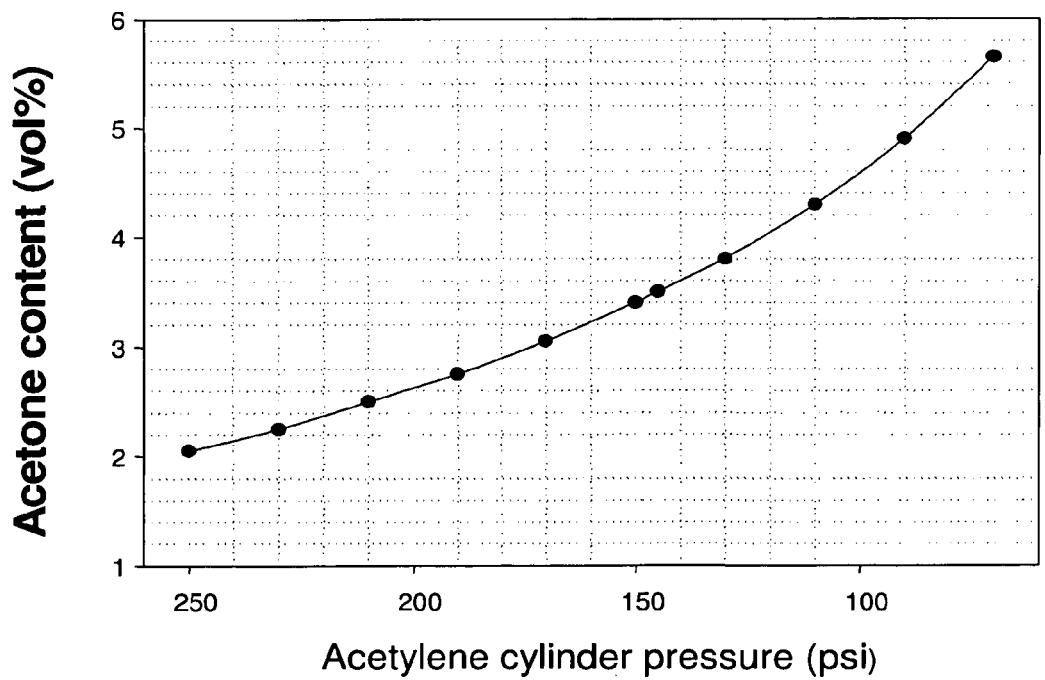
FIG. 4B is a graph showing the percent volume of stabilizer in an acetylene stream as a function of acetylene bottle pressure using an acetone-stabilized acetylene source.
Figure 5:
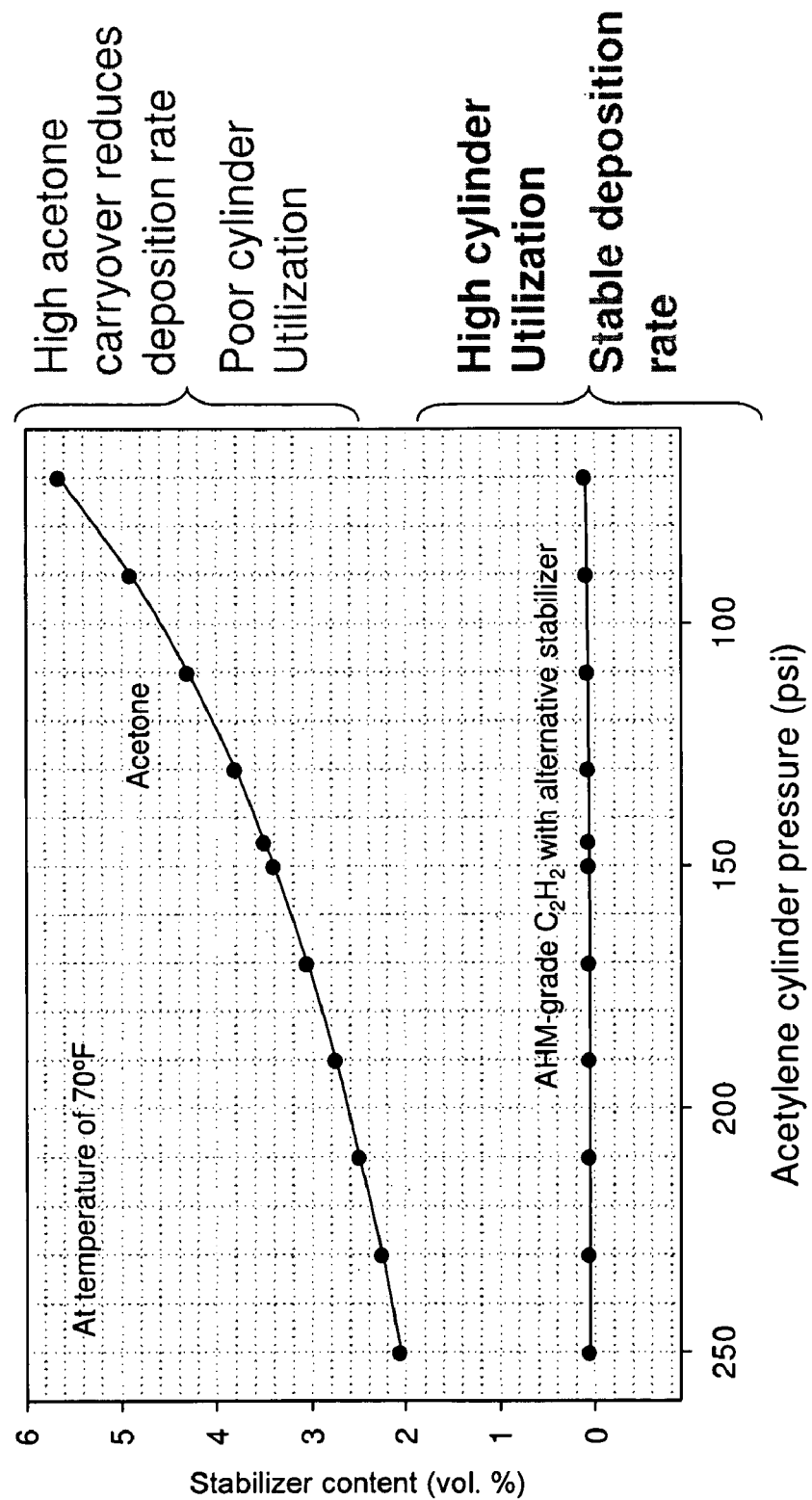
FIG. 5 is a graph comparing percent volume of stabilizer in an acetylene stream as a function of acetylene bottle pressure using a DMF-stabilized acetylene source and the percent volume of stabilizer in an acetylene stream as a function of acetylene bottle pressure using an acetone-stabilized acetylene source.

FIG. 4A shows the amount of DMF in an acetylene stream as a function of acetylene bottle pressure. As bottle pressure decreases, the amount of DMF in the vapor stream increases slightly—from 0.05% (vol.) at 250 psi to about 0.10% at less than 100 psi. For comparison, FIG. 4B shows the amount of acetone in an acetylene stream when an acetone-stabilized bottle is used. At 250 psi, about 2% (vol.) of the vapor stream is acetone, a concentration that increases to over 5% as the canister pressure drops below 100 psi. Even near the end of the life of the canister, DMF-stabilized acetylene produces a more concentrated acetylene stream than a fresh acetone-stabilized canister; the percentage DMF in the acetylene stream at less than 100 psi is 0.10%—about 20 times less than the percentage of acetone in the vapor stream from a new (250 psi) canister. The percentage stabilizer in each of the streams is compared directly in FIG. 5, in which it can be seen that DMF-stabilized bottles result in near constant amount of stabilizer in the acetylene gas stream.

The beneficial effects of DMF-stabilized bottles are due to the lower vapor pressure of DMF. DMF vapor pressure at 25 C is 3.7 torr, vs. 250 torr at 25 C for acetone. The low vapor pressure of DMF also renders it less sensitive to temperature. The volume percentage of acetone in the vapor stream is highly dependent on temperature, at 100 psi canister pressure, for example, the percentage at 40 C is 8%, compared to 5% at 20 C and about 3% at 0 C. At 40 C, DMF still makes up less than 0.5% of the vapor stream.

In a specific embodiment, the concentration of the stabilizer may be kept at about 0.1 volumetric % within less than 0.05% fluctuation over the life of the bottle. More generally, any stabilizer concentration between about 0 volumetric % and 0.4 volumetric % (or about 0 volumetric % to 0.1 volumetric %) may be steadily maintained in the acetylene gas stream entering the deposition chamber. The stable levels may correspond to variations of between about 0.01 volumetric % and 0.2 volumetric %. These requirements are typically driven by deposition.

Figure 6:
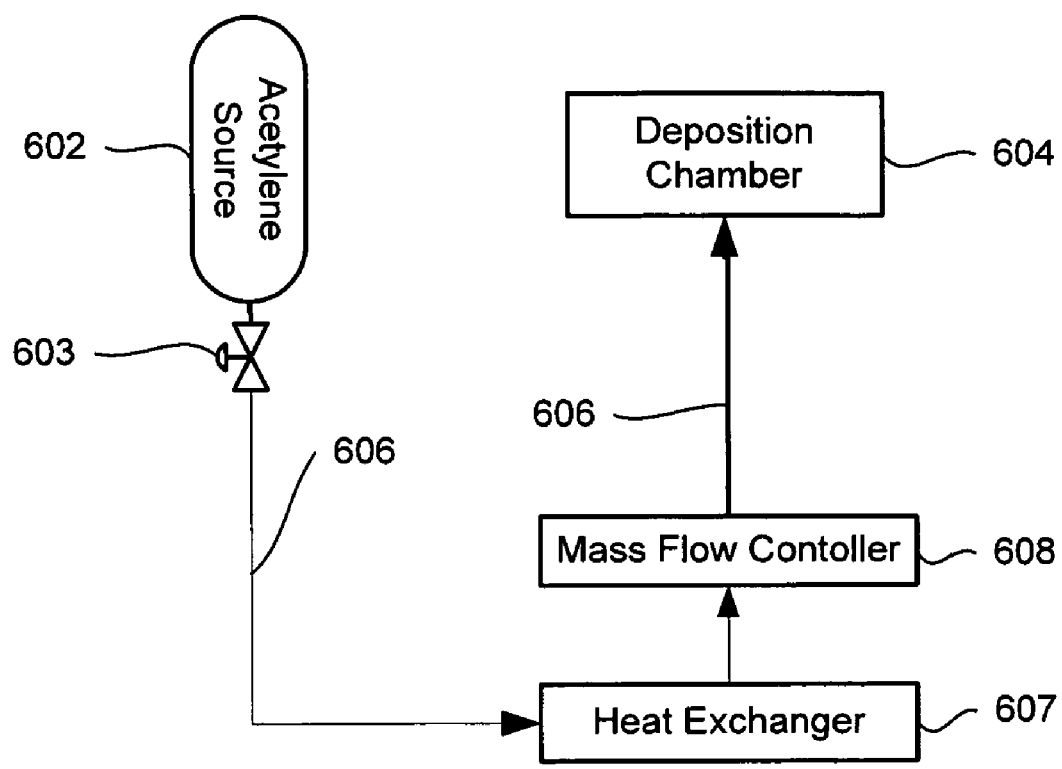
FIG. 6 is a simple block diagram depicting an acetylene source and deposition chamber that may be used in accordance with the methods described herein.

FIG. 6 is a simple block diagram depicting acetylene source 602 and deposition chamber 604, as well as other components of an apparatus suitable for carrying out the methods described herein. The acetylene canister or other acetylene source 602 has a corresponding pressure regulator and is connected to the deposition chamber. The acetylene source contains acetylene and stabilizer. Typically, the acetylene source is pressured to over 200 psi. As indicated above, DMF is used as the stabilizer in certain embodiments. Other low vapor pressure stabilizers may also be used in accordance with the methods described herein. In certain embodiments, the stabilizer has a vapor pressure of less than about 150 torr at 25 C, and more particularly lower than about 75 torr, and in certain embodiments, lower than about 10 torr. Examples of stabilizers that may be used in the methods of the invention are listed below with their vapor pressure (at 25 C unless otherwise noted):

Butanol—6 torr
Ethanol—59 torr
Ethylene glycol—0.07 torr
Methanol—127 torr
Propanol—20 torr
IPA—43 torr
Benzene—101 torr
Toluene—28 torr
o-Xylene—7 torr
m-Xylene—8 torr
p-Xylene—9 torr
Chloroform—194 torr
Acetonitrile—88 torr
Acetic Acid—16 torr
Ethyl acetate—95 torr
MEK—90 torr
Diethyl ketone (DEK)—28 torr (at 20 C)

While the acetylene source is a bottle or cylinder in many embodiments, it may also be a tank or a facility wide supply of acetylene (e.g., an acetylene resource plumbed into the facility). In certain embodiments, the acetylene source is a cubic feet acetylene cylinder that contains a filler material and stabilizer in addition to the safety relief devices. Usually standard-sized hollow steel cylinders generally used for compressed gas service are also used for acetylene. In specific example, a 390 cubit feet acetylene cylinder that contains approximately 27 lbs of acetylene and approximately 28 lbs of DMF and filled with porous calcium silicate may be used. The cylinder may be used at service pressure of 250 psi at 70°

F. In certain embodiments, ganged cylinders, i.e., cylinders connected to a common gas line. Ganged cylinders are impractical when using acetone-stabilized cylinders; because much of the acetone leaves the cylinder in the vapor stream, acetone needs to be recharged into the cylinder at each refill. This limits the use of ganged bottle configurations due to the requirement to dissemble the assembly to allow refilling of each cylinder with acetone. With DMF or other low vapor pressure stabilizers, however, the cylinders may be used without refilling the acetylene or stabilizer.

When the acetylene gas stream is discharged from the acetylene source, it first passes through the pressure regulator 603 where the service pressure of the cylinder is reduced to a safe level below 15 psig. The acetylene is then passed via a processing line 606 and into the deposition chamber 604. Suitable materials for the processing line 606 include steel and wrought iron. Generally cast iron, unalloyed copper, silver, or mercury are avoided because of possibility of forming explosive acetylides. The acetylene gas stream in the processing line may include some stabilizer vapor in addition to acetylene. The stabilizer concentration in the processing line is typically in range of about 0.01% to 0.1% depending on the current service pressure of the acetylene cylinder. The temperature of the acetylene gas stream in the line depends on the storage conditions of the acetylene cylinder, evaporation rate and other factors. In certain embodiments, the stream may first be passed through a heat exchanger 607 to regulate the temperature of the acetylene during deposition. In certain embodiments, the heat exchanger 607 can maintain the temperature of the acetylene gas stream between about 10° C. and 50° C. In one specific embodiment, the temperature is maintained between about 15 and 30° C.

The acetylene gas stream then flows through the mass flow controller (MFC) 608 and into the deposition chamber 604. The MFC 608 may be calibrated relative to specific ranges for the properties of the reduced storage solvent concentration acetylene gas stream, such as temperature, composition, pressure, desired flow rate, and others. The MFC 608 may be fitted with a closed loop control system which is given an input signal by the operator or an external system, wherein the input value is compared to a value from the mass flow sensor and a valve of the MFC is adjusted accordingly to achieve the required flow rate.

Finally, the acetylene gas stream flows into the deposition chamber 604. The deposition chamber 604 is described in more details in the context of FIG. 10. The acetylene gas stream may be used as a carbon containing precursor that is used to form a layer of high carbon content material on a semiconductor substrate during fabrication of an electronic device. This process is performed in the deposition chamber 604.

EXAMPLES

The following examples are provided to further illustrate aspects and advantages of the present invention. These examples are provided to exemplify and more clearly illustrate aspects of the present invention and are in no way intended to be limiting.

Ashable hard mask films were deposited on wafers using DMF and acetone-stabilized bottles. Film thickness was measured at various bottle usages (as indicated by the percentage acetylene remaining in the bottle). Data was collected for batches of 50 wafers for each test with 5 sample wafers per batch. The sample wafers were taken from the beginning, middle and end of the batch. Deposition time was about 28 seconds and deposition temperature was 350° C. Flow rate was 5.5 standard liters per minute. Results are shown in FIG. 3B, discussed above.

To test repeatability of carbon-based film deposition throughout the life of an acetylene bottle, film non-uniformity and thickness, film optical properties, stress and defects were measured for films deposited at stages of bottle life. Deposition thickness and non-uniformity results are shown in FIG. 3A, discussed above.

Figure 7:
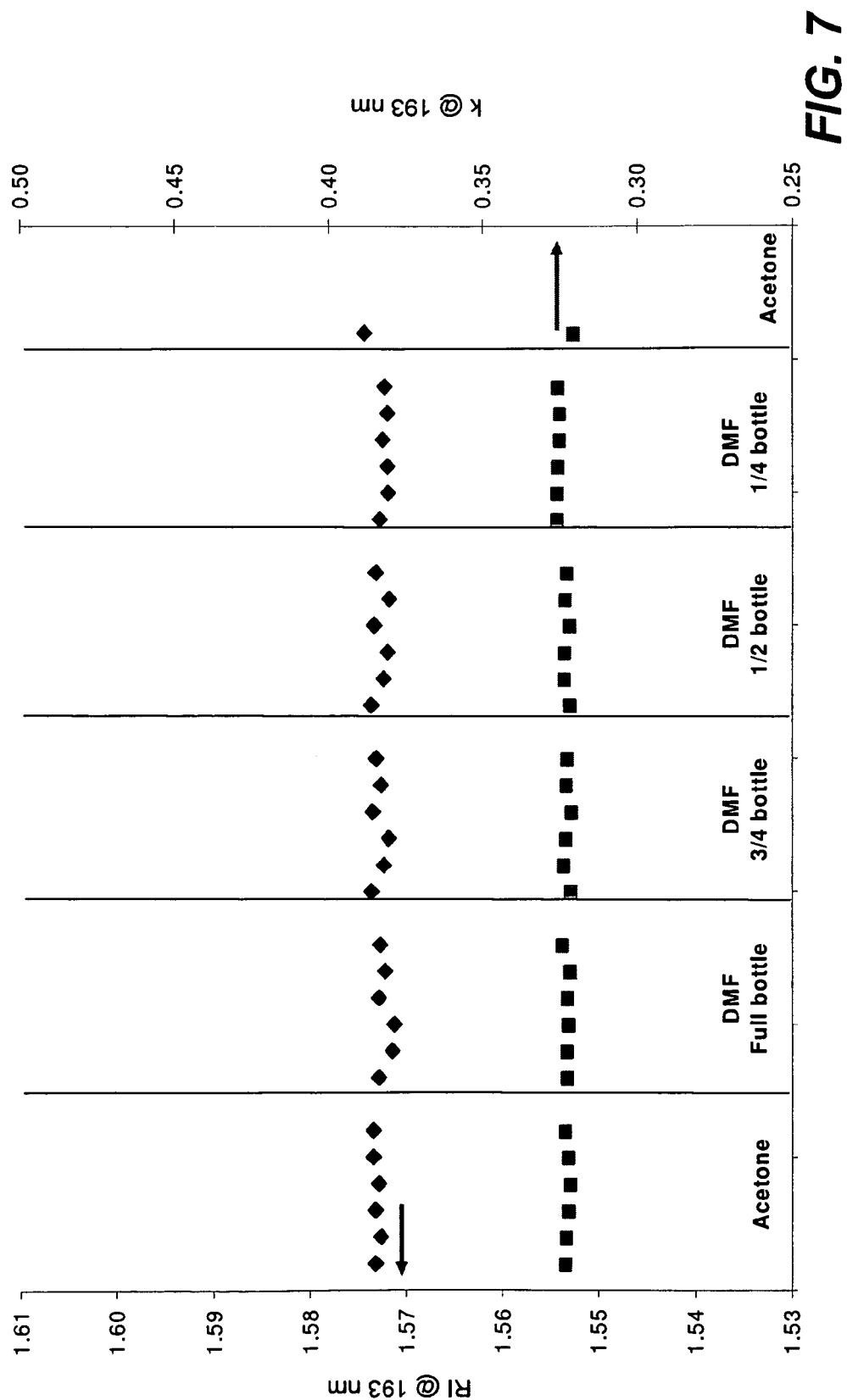
FIG. 7 is a plot showing the repeatability of optical properties obtained using DMF-stabilized bottles throughout the life of a bottle. Index of refraction (RI) and extinction coefficient (k) at 193 nm are shown on the left and right y-axis, respectively, for ashable hardmask films deposited using acetylene bottles at 0-¼-full, ¼-½ full, ½-¾ full and ¾-completely full (as based on total bottle pressure), as compared to films deposited using full acetone-stabilized bottles.

FIG. 7 shows the index of refraction, RI, and extinction coefficient, k, at 193 nm of the deposited ashable hardmasks. Optical property values are substantially constant over the life of the bottle, varying by no more than about 0.03%. These values are also comparable to the RI and k achieved with acetone-stabilized acetylene (full bottle). This is significant because unlike acetone, DMF contains nitrogen, the presence of would be expected to shift the optical properties. The index of refraction and extinction coefficient at 633 nm were also measured and similarly found not to vary over the life of the acetylene-stabilized bottle and was comparable to acetone-stabilized acetylene.

Figure 8:
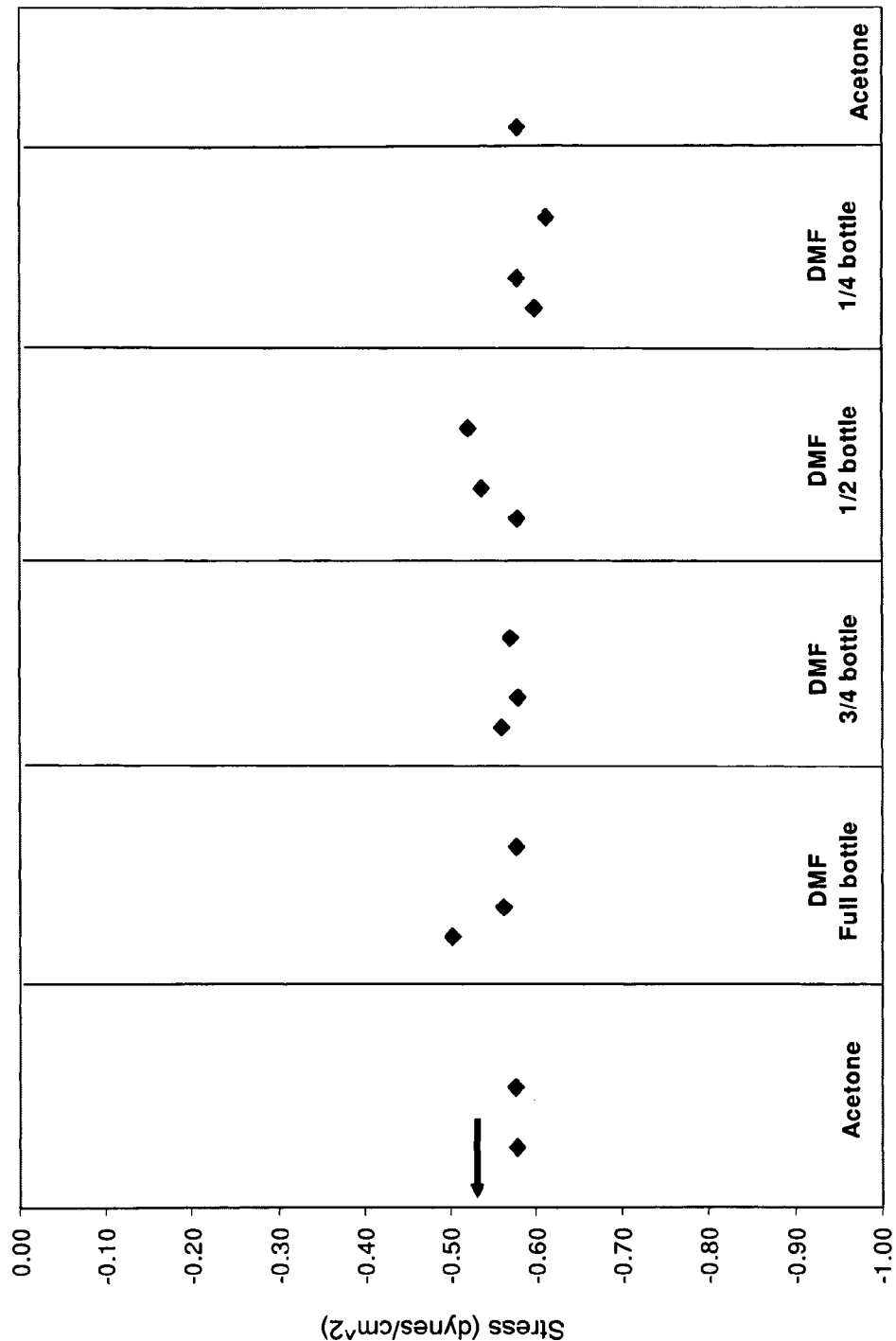
FIG. 8 is a plot showing the repeatability of mechanical properties obtained using DMF-stabilized bottles throughout the life of a bottle. Stress in dynes/cm$^2$ is shown for ashable hardmask films deposited using acetylene bottles at 0-¼-full, ¼-½ full, ½-¾ full and ¾-completely full (as based on total bottle pressure), as compared to films deposited using full acetone-stabilized bottles.

FIG. 8 shows stress level in the deposited ashable hardmasks. Values are substantially constant over the life of the bottle, varying by no more than about 0.8%. These values are also comparable to the stress achieved with acetone-stabilized acetylene (full bottle).

Figure 9:
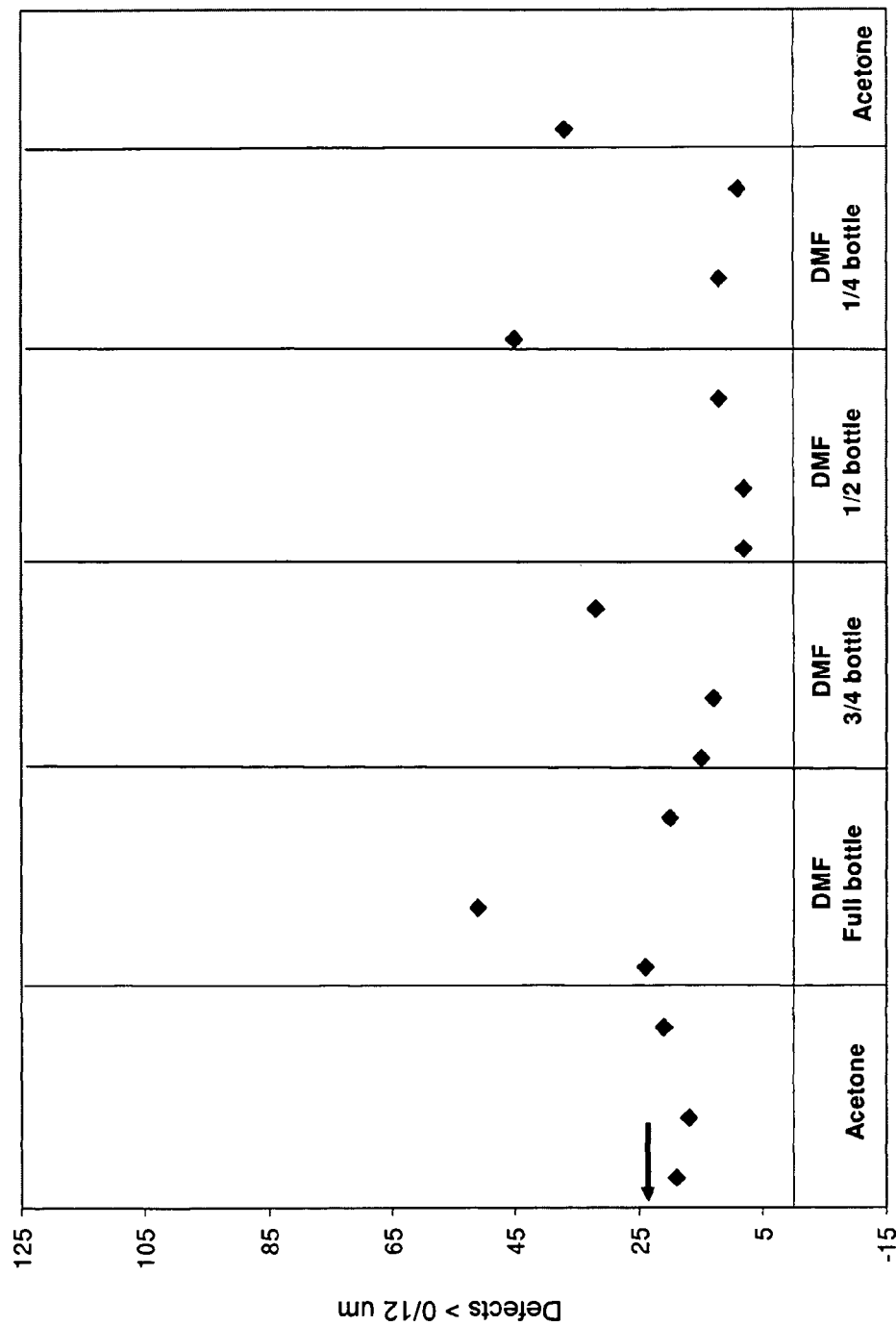
FIG. 9 is a plot showing the repeatability of film quality obtained using DMF-stabilized bottles throughout the life of a bottle. The number of defects larger than 0.12 micrometers is shown for ashable hardmask films deposited using acetylene bottles at 0-¼-full, ¼-½ full, ½-¾ full and ¾-completely full (as based on total bottle pressure), as compared to films deposited using full acetone-stabilized bottles.

Finally, FIG. 9 shows the number of defects larger than 0.12 micrometers in the deposited ashable hardmasks. As with the other measured properties, no trending is observed over the life of the bottle and the number of defects is no greater than achieved with acetone-stabilized acetylene. This result is significant because the rapid decomposition of acetylene and the fact that there is significantly less stabilizer in the vapor stream would be expected to result in more defects. However, as FIG. 9 shows, the number of defects is comparable to that achieved using a more dilute acetylene stream.

The number of wafers that may be processed per bottle (without having to refill or change the bottle) is about 5 times higher for a DMF-stabilized bottle than for an acetone-stabilized bottle. This is due to the significantly higher usable amount of acetylene in DMF-stabilized bottles. For example, to deposit 5000 Angstroms of ashable hardmask on wafers, one 360 cubic feet DMF-stabilized bottle, of which 95% of the acetylene within the bottle is usable, can be used to process almost 5500 wafers. The same size acetone-stabilized bottle, having only about 20% usability, can be used to process only about 1100 wafers.

Apparatus

The present invention is preferably implemented in a plasma enhanced chemical vapor deposition (PECVD) reactor. Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing hard mask deposition is transferred from one station to another within a reactor chamber during the process. For example, for a 2000 Å hard mask film deposition, 500 Å of film may be deposited at each of four stations in accordance with the present invention. Of course, the full film deposition may occur entirely at a single station or any fraction of the total film thickness may be deposited at any number of stations.

While in process, each wafer is held in place by a pedestal, wafer chuck and/or other wafer holding apparatus. For certain operations in which the wafer is to be heated, the apparatus may include a heater such as a heating plate. In a preferred embodiment of the invention, a Vector™ (e.g., C23 Vector) or Sequel™ (e.g., C2 Sequel) reactor, produced by Novellus Systems of San Jose, Calif., may be used to implement the invention.

Figure 10:
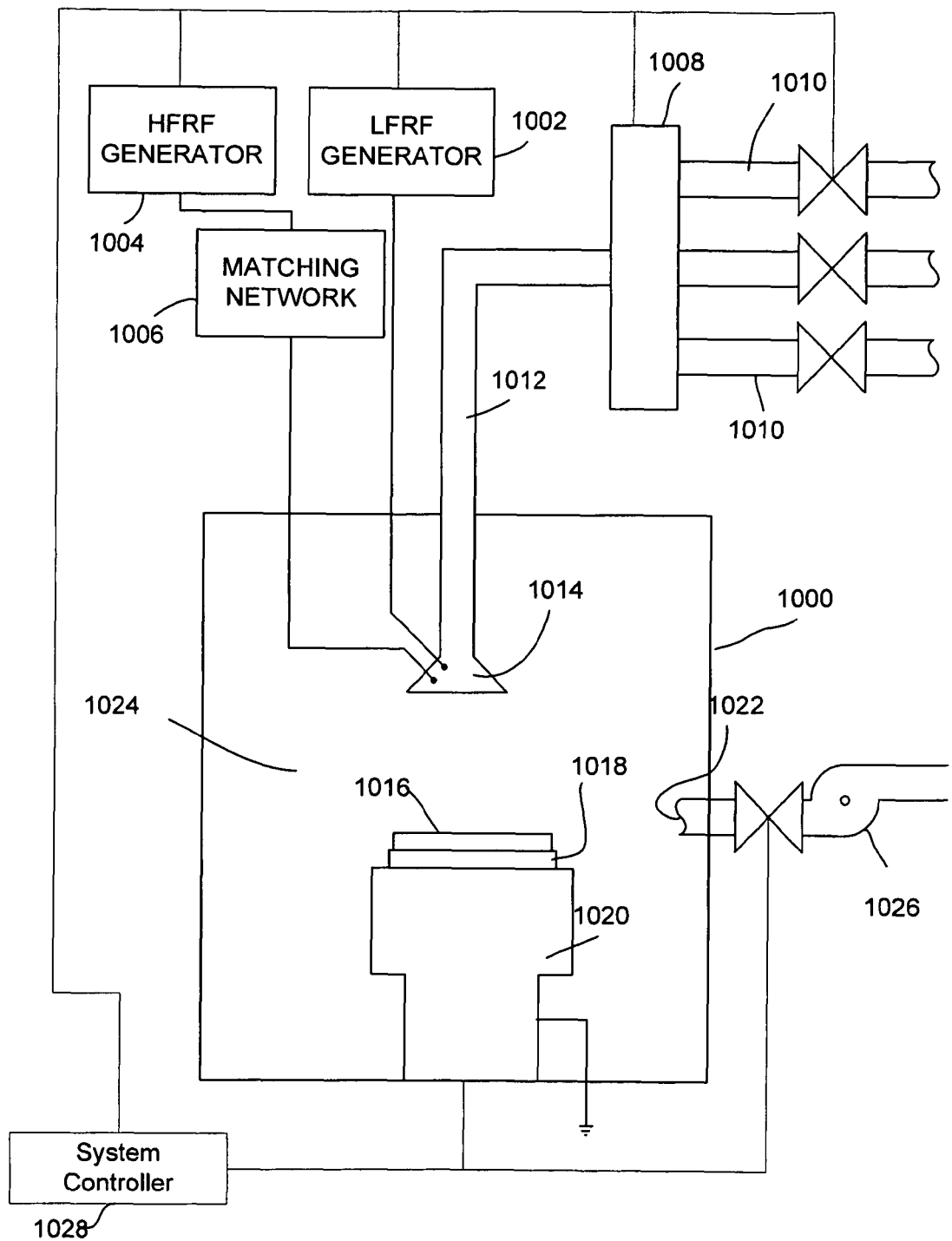
FIG. 10 is a block diagram depicting a PECVD reactor arranged for depositing a layer of high carbon content material on a semiconductor substrate.

FIG. 10 provides a simple block diagram depicting various reactor components arranged for implementing the present invention. As shown, a reactor 1000 includes a process chamber 1024, which encloses other components of the reactor and serves to contain the plasma generated by a capacitor type system including a showerhead 1014 working in conjunction with a grounded heater block 1020. A high-frequency RF generator 1002, connected to a matching network 1006, and a low-frequency RF generator 1004 are connected to showerhead 1014. Alternatively, a low-frequency RF generator 1004 may connected to the substrate 1016. The power and frequency supplied by matching network 1006 is sufficient to generate a plasma from the process gas, for example 400-700 W total energy. In a typical process, the high frequency RF component is generally between 2-60 MHz; in a preferred embodiment, the HF component is 13.56 MHz. The LF component can be from 100 kHz-2 MHz; in a preferred embodiment, the LF component is 400 kHz.

Within the reactor, a wafer pedestal 1018 supports a substrate 1016. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 1012. Multiple source gas lines 1010 are connected to manifold 1008. The gases may be premixed or not. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 1000 via an outlet 1022. A vacuum pump 1026 (e.g., a one or two stage mechanical dry pump and/or a turbomolecular pump) typically draws process gases out and maintains a suitably low pressure within the reactor by a close loop controlled flow restriction device, such as a throttle valve or a pendulum valve. A system controller 1028 may be used to control the deposition process.

The invention may be implemented on a multi-station or a single station tool. In one embodiment, the pre-processing module is used for treating acetylene gas stream supplied to a semiconductor deposition chamber. Any deposition chamber that may use acetylene for semiconductor manufacturing can be used with pre-processing modules of this invention. In specific embodiments, the 300 mm Novellus Vector™ tool having a 4-station deposition scheme or the 200 mm Novellus Sequel™ tool having a 6-station deposition scheme can be used. Other deposition chambers may also be used.

In one specific embodiment, a 300 mm Novellus Vector™ tool with 4 deposition stations may be used to deposit an ashable hardmask onto a 300 mm wafer. The process may include four operations: undercoat deposition, ashable hard mask pre-coat, ashable hard mask deposition, and chamber cleaning. The acetylene gas stream may be used in the ashable hard mask pre-coat and ashable hard mask deposition operations only. The acetylene gas stream gas stream that passes through the pre-processing module may be delivered at 6,750 sccm during these operations. The dual-frequency PECVD module may provide Low Frequency (LF) power of about 200-600 W and High Frequency (HF) power at about 900-1500 W during these operation, while the process chamber was maintained at approximately 4-12 Torr.

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein. All references cited herein are incorporated by reference for all purposes.

What is claimed is:

1. A method of depositing a carbon-based film on a semiconductor substrate during fabrication of an electronic device, the method comprising:
   providing a pressurized container of acetylene comprising a solvent having a vapor pressure of less than about 10 torr at 25 C and in which acetylene is soluble upstream of a deposition chamber;
   delivering an acetylene gas stream from the pressurized container to a deposition chamber for forming the carbon-based film; and
   depositing the carbon-based film on the semiconductor substrate via a chemical vapor deposition reaction of the acetylene.

2. The method of claim 1 wherein the solvent is dimethlyformamide.

3. The method of claim 1 further comprising sequentially depositing carbon-based films on a plurality of semiconductor substrates via chemical vapor deposition reactions of acetylene delivered from the pressurized container, wherein at least 50% of acetylene in the container is used.

4. The method of claim 3 wherein at least 75% of acetylene in the container is used in the deposition process without repressurization or refilling.

5. The method of claim 3 wherein at least 90% of acetylene in the container is used in the deposition process without repressurization or refilling.

6. The method of claim 3 wherein film thickness is substantially constant from substrate-to-substrate.

7. The method of claim 1, wherein the carbon-based film comprises amorphous carbon.

8. The method of claim 1, wherein the carbon-based film forms an ashable hard mask on said semiconductor substrate.

9. The method of claim 1 further comprising performing a sequential chemical vapor deposition process, comprising sequentially introducing a plurality of substrates to the deposition chamber and depositing a high carbon content layer on each substrate from the acetylene gas stream, wherein the sequential deposition process is performed at least until no more than 50% of the acetylene remains in the container and wherein the thickness non-uniformity across of the deposited layer across the plurality of substrates varies by no more than 0.5% over the life the container.

10. The method of claim 9 wherein the sequential deposition process is performed at least until no more than 25% of the acetylene remains in the container.

11. The method of claim 9 wherein the thickness non-uniformity across of the deposited layer across the plurality of substrates varies by no more than 1% over the life the container.

12. A method of depositing high carbon content layers on a plurality of semiconductor substrates, the method comprising:

performing a sequential chemical vapor deposition process, comprising:

sequentially introducing a plurality of substrates to a deposition chamber and depositing a high carbon content layer on each substrate, wherein depositing a high carbon content layer on each substrate comprises delivering an acetylene gas stream from a pressurized cylinder of acetylene, said cylinder comprising an acetylene stabilizer having a vapor pressure of no more than about 10 torr at 25 C, to the deposition chamber and depositing high carbon content layers on the plurality of substrates via a chemical vapor deposition reaction of acetylene, wherein the sequential deposition process is performed at least until no more than 50% of the acetylene remains in the cylinder and wherein the thickness non-uniformity across of the deposited layer across the plurality of substrates varies by no more than 0.5% over the life the cylinder.

13. The method of claim 12 wherein the low vapor pressure solvent is dimethlylformamide.

14. The method of claim 12 wherein the sequential deposition process is performed at least until no more than 25% of the acetylene remains in the cylinder.

15. The method of claim 12 wherein the thickness non-uniformity across of the deposited layer across the plurality of substrates varies by no more than 1% over the life the cylinder.

16. The method of claim 12, wherein the high carbon content layer comprises amorphous carbon.

17. The method of claim 12, wherein the high carbon content layer forms an ashable hard mask on said semiconductor substrate.

* * * * *